(12) United States Patent
Hsieh et al.

(10) Patent No.: US 9,941,152 B2
(45) Date of Patent: Apr. 10, 2018

(54) MECHANISM FOR FORMING METAL GATE STRUCTURE

(71) Applicant: Taiwan Semiconductor Manufacturing Co., Ltd, Hsinchu (TW)

(72) Inventors: Wen-Jia Hsieh, Pusin Township (TW); Chih-Lin Wang, Zhubei (TW); Chia-Der Chang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/425,639

(22) Filed: Feb. 6, 2017

(65) Prior Publication Data

US 2017/0148665 A1     May 25, 2017

Related U.S. Application Data

(62) Division of application No. 14/037,881, filed on Sep. 26, 2013, now Pat. No. 9,564,332.

(51) Int. Cl.
| *H01L 21/768* | (2006.01) |
| *H01L 21/28* | (2006.01) |
| *H01L 21/285* | (2006.01) |
| *H01L 21/02* | (2006.01) |
| *H01L 29/66* | (2006.01) |

(52) U.S. Cl.
CPC .. *H01L 21/76814* (2013.01); *H01L 21/02244* (2013.01); *H01L 21/28088* (2013.01); *H01L 21/28518* (2013.01); *H01L 21/76805* (2013.01); *H01L 21/76895* (2013.01); *H01L 29/66545* (2013.01)

(58) Field of Classification Search
CPC ......... H01L 21/02244; H01L 21/28088; H01L 21/28518; H01L 21/76805; H01L 29/66545
See application file for complete search history.

(56) References Cited

U.S. PATENT DOCUMENTS

| 2004/0043517 | A1 | 3/2004 | Sashida | |
| 2007/0243691 | A1 | 10/2007 | Matsuura et al. | |
| 2010/0127336 | A1* | 5/2010 | Chambers | ......... H01L 21/28088 257/369 |
| 2011/0081774 | A1* | 4/2011 | Yeh | .................. H01L 21/823835 438/591 |
| 2011/0086502 | A1* | 4/2011 | Yeh | ..................... H01L 29/7833 438/585 |

(Continued)

*Primary Examiner* — Stephen Bradley
*Assistant Examiner* — Long H Le
(74) *Attorney, Agent, or Firm* — Birch, Stewart, Kolasch & Birch, LLP

(57) ABSTRACT

Embodiments of mechanisms for forming a semiconductor device are provided. The semiconductor device includes a semiconductor substrate and a metal gate stack formed over the semiconductor substrate. The semiconductor device also includes an insulating layer formed over the semiconductor substrate and surrounding the metal gate stack, wherein the metal gate stack includes a metal gate electrode. The semiconductor device further includes a metal oxide structure formed over the insulating layer and in direct contact with the insulating layer. The metal oxide structure includes an oxidized material of the metal gate electrode.

20 Claims, 6 Drawing Sheets

(56) References Cited

U.S. PATENT DOCUMENTS

| | | |
|---|---|---|
| 2011/0156107 A1 | 6/2011 | Bohr et al. |
| 2012/0193807 A1 | 8/2012 | Chumakov et al. |
| 2012/0313218 A1 | 12/2012 | Fujimori et al. |
| 2013/0320414 A1 | 12/2013 | Fan et al. |
| 2014/0099784 A1 | 4/2014 | Kim et al. |

* cited by examiner

MECHANISM FOR FORMING METAL GATE STRUCTURE

CROSS-REFERENCE TO RELATED APPLICATION

This Application is a Divisional of co-pending U.S. patent application Ser. No. 14/037,881 filed on Sep. 26, 2013, which is hereby expressly incorporated by reference into the present application.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs.

However, since the feature sizes continue to decrease, fabrication processes continue to become more difficult to perform. Therefore, it is a challenge to form reliable semiconductor devices with smaller and smaller sizes.

BRIEF DESCRIPTION OF THE DRAWINGS

For a more complete understanding of the embodiments, and the advantages thereof, reference is now made to the following descriptions taken in conjunction with the accompany drawings.

DETAILED DESCRIPTION OF THE ILLUSTRATIVE EMBODIMENTS

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact. Some variations of the embodiments are described. Throughout the various views and illustrative embodiments, like reference numbers are used to designate like elements.

Figure 1A:
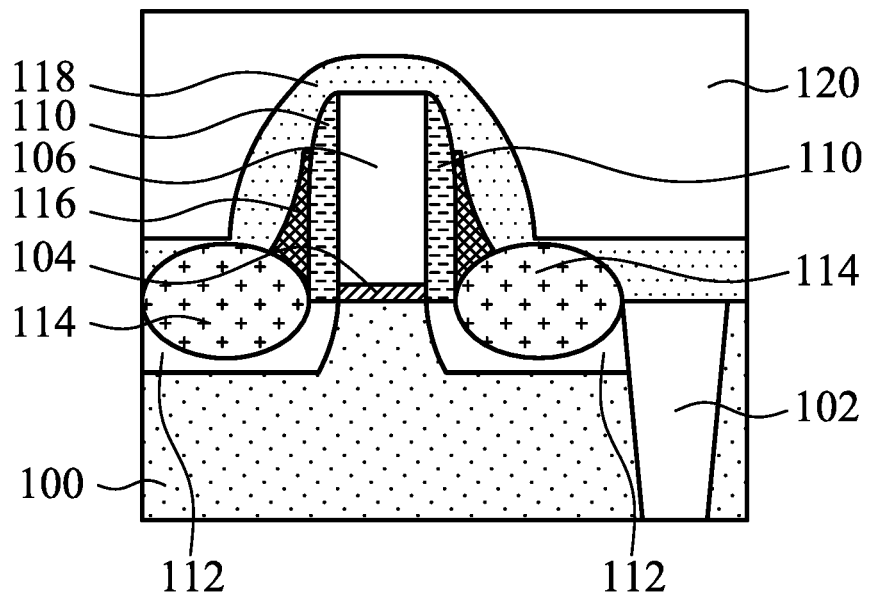
FIGS. 1A-1J are cross-sectional views of various stages of a process for forming a semiconductor device, in accordance with some embodiments.

FIGS. 1A-1J are cross-sectional views of various stages of a process for forming a semiconductor device, in accordance with some embodiments. Referring to FIG. 1A, a semiconductor substrate 100 is provided. The semiconductor substrate 100 may be a semiconductor wafer (such as a silicon wafer) or a portion of a semiconductor wafer.

In some embodiments, the semiconductor substrate 100 is made of an elementary semiconductor material including silicon or germanium in a single crystal, polycrystal, or amorphous structure. In some other embodiments, the semiconductor substrate 100 is made of a compound semiconductor, such as silicon carbide, gallium arsenide, gallium phosphide, indium phosphide, indium arsenide, an alloy semiconductor, such as SiGe, or GaAsP, or combinations thereof. The semiconductor substrate 100 may also include multi-layer semiconductors, semiconductor on insulator (SOI) (such as silicon on insulator or germanium on insulator), or combinations thereof.

An isolation structure 102 is formed in the semiconductor substrate 100 to define various active regions in the semiconductor substrate 100, and to electrically isolate neighboring devices (e.g. transistors) from one another. The isolation structure 102 may be made of a dielectric material, such as silicon oxide, silicon nitride, silicon oxynitride, fluoride-doped silicate glass (FSG), a low-K dielectric material, other suitable materials, or combinations thereof. The isolation structure 102 may be formed by using an isolation technology, such as local oxidation of semiconductor (LOCOS), shallow trench isolation (STI), or the like.

In some embodiments, the formation of the isolation structure 102 includes patterning the semiconductor substrate 100 by a photolithography process, etching a trench in the semiconductor substrate 100 (for example, by using a dry etching, wet etching, plasma etching process, or combinations thereof), and filling the trench (for example, by using a chemical vapor deposition process) with the dielectric material. In some embodiments, the filled trench may have a multi-layer structure, such as a thermal oxide liner layer filled with silicon nitride or silicon oxide. However, in some embodiments, the isolation structure 102 is optional.

As shown in FIG. 1A, a gate dielectric layer 104 and a dummy gate 106 are formed over the semiconductor substrate 100 for defining active regions in the semiconductor substrate 100. A gate-last approach or replacement-gate (RPG) approach will be subsequently performed to form a metal gate. The dummy gate 106 may be made of polysilicon.

The gate dielectric layer 104 may serve as a dummy gate dielectric layer and is removed in a subsequent process. The gate dielectric layer 104 may be made of silicon oxide. However, in some other embodiments, the gate dielectric layer 104 does not serve as a dummy gate dielectric layer and will not be subsequently removed. In these cases, the gate dielectric layer 104 may be made of silicon oxide, silicon oxynitride, a high dielectric constant material (high-k material), or combinations thereof.

As shown in FIG. 1A, spacers 110 are formed over sidewalls of the dummy gate 106. The spacers 110 may be made of a dielectric material, such as silicon nitride layer, silicon oxynitride layer, or combinations thereof. The structure of the spacers 110 shown in FIG. 1A is merely an example. Other configurations of the spacers 110 are also possible. For example, a sealing layer (not shown) is formed between the spacers 110 and the dummy gate 106.

Doped regions and 112 may be formed in the semiconductor substrate 100 by using a suitable process, such as an ion implantation process. The doped regions 112 may be a heavily doped source region and a heavily doped drain region, which may be formed after the spacers 110 are formed.

Stressors 114 may be formed in the doped regions 112 by using suitable processes. The suitable processes include, for example, an etching process for removing a portion of the semiconductor substrate 100 and a selective epitaxial growth (SEG) process. Depending on the desired type of the resulting MOS device, either stressors applying a compressive stress to the channel region (such as SiGe stressors) or stressors applying a tensile stress to the channel region (such as SiC stressors) are formed.

Spacer oxide layers 116 may be formed over the spacers 110 and the stressors 114 by using, for example, a chemical vapor deposition process. The spacer oxide layers 116 may fill the gaps between the spacers 110 and the stressors 114 to facilitate films, which are subsequently formed, to cover the spacers 110 and the stressors 114 smoothly. However, in some embodiments, the spacer oxide layers 116 are optional.

A contact etch stop layer 118 is formed over the semiconductor substrate 100 and the dummy gate 106, in accordance with some embodiments. The contact etch stop layer 118 may be made of a dielectric material, such as silicon nitride. The contact etch stop layer 118 may be formed over the spacers 110, the dummy gate 106, and the semiconductor substrate 100. However, in some embodiments, the contact etch stop layer 118 is not needed.

As shown in FIG. 1A, an insulating layer 120 is then deposited over the dummy gate 106 and the semiconductor substrate 100, in accordance with some embodiments. The insulating layer 120 may be made of any suitable insulating material, such as silicon oxide, silicon oxynitride, borosilicate glass (BSG), phosphoric silicate glass (PSG), borophosphosilicate glass (BPSG), fluorinated silicate glass (FSG), low-k material, porous dielectric material, or combinations thereof. The insulating layer 120 may be deposited by any suitable process, such as a CVD process, HDPCVD process, spin-on process, sputtering process, or combinations thereof.

Figure 1B:
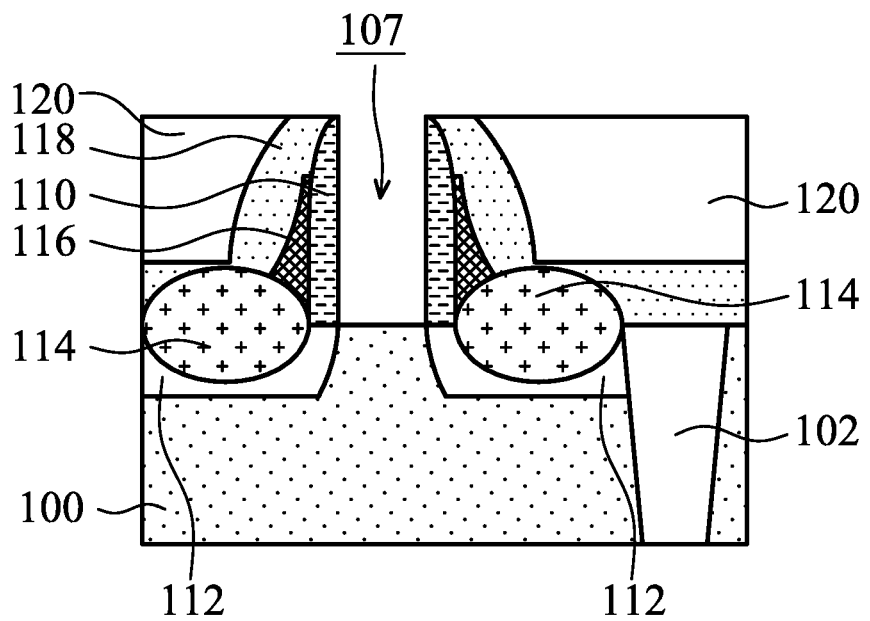

Afterwards, as shown in FIG. 1B, a planarization process, such as a chemical mechanical polishing (CMP) or the like, is then performed to the insulating layer 120 until a top surface of the dummy gate 106 is exposed. After the planarization process is performed, the insulating layer 120 may have a substantially planar surface to facilitate subsequent process steps.

Then, the dummy gate 106 is removed by using a suitable process, such as a wet etching process, a dry etching process, or combinations thereof. In some embodiments, the gate dielectric layer 104 is also removed. After the dummy gate 106 and the gate dielectric layer 104 are removed, an opening 107 is formed between the spacers 110. The opening 107 may be a trench.

Figure 1C:
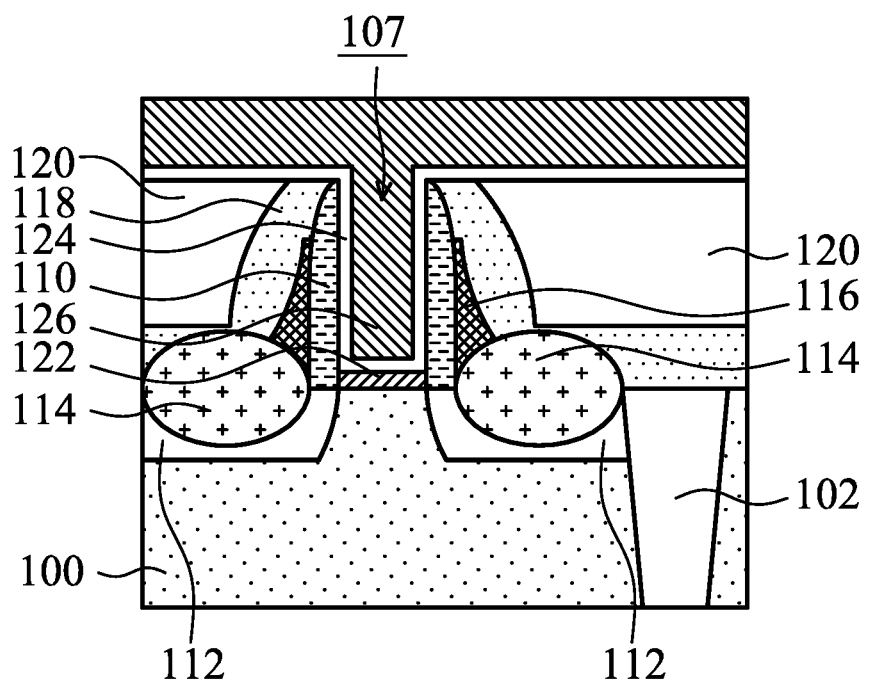

As shown in FIG. 1C, a gate dielectric layer 122 is formed to cover a bottom of the opening 107, in accordance with some embodiments. The gate dielectric layer 122 may be made of a dielectric material, such as a high dielectric constant (high-k) material. The high-k material may be made of hafnium oxide ($HfO_2$), hafnium silicon oxide (HfSiO), hafnium silicon oxynitride (HfSiON), hafnium tantalum oxide (HMO), hafnium titanium oxide (HfTiO), hafnium zirconium oxide (HfZrO), other suitable high-k dielectric materials, or combinations thereof.

The high-k material may be further made of metal oxides, metal nitrides, metal silicates, transition metal-oxides, transition metal-nitrides, transition metal-silicates, oxynitrides of metals, aluminum oxide, hafnium dioxide-alumina ($HfO_2$—$Al_2O_3$) alloy, other suitable materials, or combinations thereof.

The gate dielectric layer 122 may be deposited by any suitable process, such as atomic layer deposition (ALD), chemical vapor deposition (CVD), physical vapor deposition (PVD), sputtering, plating, other suitable processes, or combinations thereof. In some embodiments, the gate dielectric layer 122 needs to be further annealed.

An intermediate dielectric layer (not shown) may be formed over the semiconductor substrate 100 before the gate dielectric layer 122 is formed. The intermediate dielectric layer may be made of a suitable dielectric material, such as silicon oxide, hafnium silicate, silicon oxynitride, or combinations thereof.

As shown in FIG. 1C, a work function metal layer 124 is deposited over the insulating layer 120 and the gate dielectric layer 122 in the opening 107, in accordance with some embodiments. The work function metal layer 124 provides a desired work function for transistors to enhance device performance including improved threshold voltage. In the embodiments of forming an NMOS transistor, the work function metal layer 124 can be an n-type metal capable of providing a work function value suitable for the device, such as equal to or less than about 4.5 eV. The n-type metal may be made of metal, metal carbide, metal nitride, or combinations thereof. For example, the n-type metal is made of tantalum, tantalum nitride, or combinations thereof.

On the other hand, in the embodiments of forming a PMOS transistor, the work function metal layer 124 can be a p-type metal capable of providing a work function value suitable for the device, such as equal to or greater than about 4.8 eV. The p-type metal may be made of metal, metal carbide, metal nitride, other suitable materials, or combinations thereof. For example, the p-type metal is made of titanium, titanium nitride, other suitable materials, or combinations thereof.

The work function metal layer 124 may also be made of hafnium, zirconium, titanium, tantalum, aluminum, metal carbides (e.g., hafnium carbide, or zirconium carbide), aluminides, ruthenium or combinations thereof. The work function metal layer 124 may be deposited by using a PVD process, CVD process, ALD process, plating process, another suitable method, or combinations thereof.

A gate electrode layer 126 (also called a metal gate electrode layer) is then deposited over the semiconductor substrate 100 and the work function metal layer 124 to fill the opening 107. The gate electrode layer 126 may be made of a suitable metal material, such as aluminum, tungsten, gold, platinum, cobalt, other suitable metal, alloy thereof, or combinations thereof. The gate electrode layer 126 may be deposited by using a PVD process, CVD process, plating process, the like, or combinations thereof.

Figure 1D:
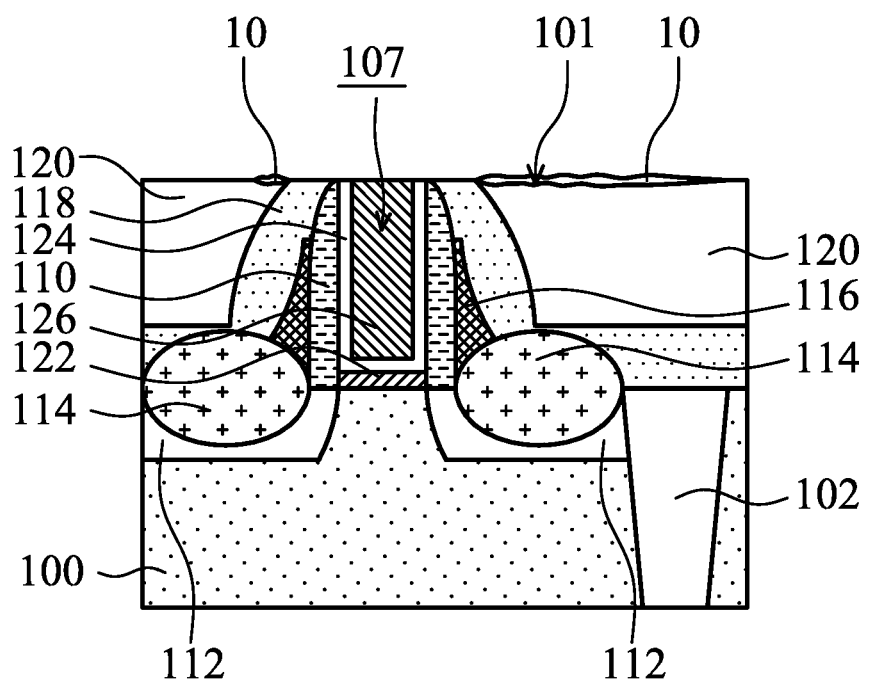

Afterwards, as shown in FIG. 1D, a planarization process, such as a chemical mechanical polishing (CMP) process or the like, is performed to remove the gate electrode layer 126 and the work function metal layer 124 outside of the opening 107. The gate electrode layer 126, the work function metal layer 124, and the gate dielectric layer 122 together form a gate stack (i.e., a metal gate stack), which is surrounded by the insulating layer 120. The gate electrode layer 126 remaining in the opening 107 may serve as a metal gate electrode of the gate stack.

After the CMP process is completed, residues 10 may be left over the surfaces 101 of the insulating layer 120, the contact etch stop layer 118, the work function metal layer 124, and/or the gate electrode layer 126. The residues 10 may come from the gate electrode layer 126 or the work function metal layer 124 formed outside of the opening 107.

The residues 10 may be metal containing residues. Therefore, adhesion between the surfaces 101 and a subsequently formed layer is negatively affected by the residues 10. Besides, etchants used in subsequent formations of contacts and a metal salicidation process may etch the residues 10, and therefore voids may be formed at the interface between the surfaces 101 and the layer formed on the surfaces 101.

The poor interfacial adhesion and the voids would allow the etchants to diffuse through the poor interface to come in contact with and damage the gate electrode layer 126. The etchants could cause interfacial delamination, and the gate electrode layer 126 could be removed. The interfacial delamination and the lost of the gate electrode layer 126 would reduce process yields.

Figure 1E:
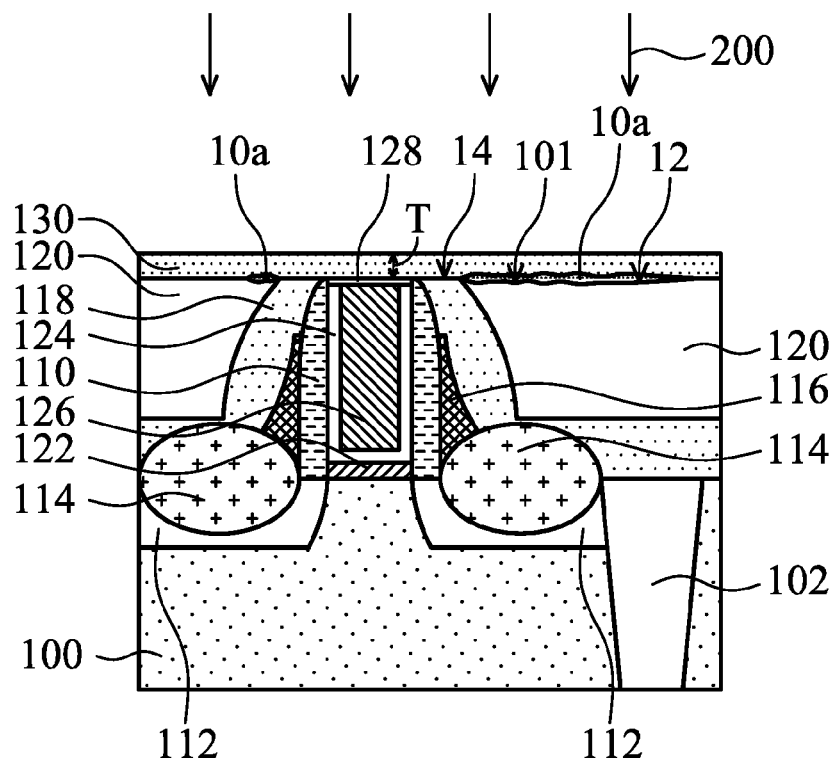

As shown in FIG. 1E, to resolve or reduce the problems described above, an oxidation process is adopted to oxidize the residues 10 into metal oxide structures 10a. The metal oxide structures 10a may be in direct contact with the insulating layer 120 and/or the contact etch stop layer 118.

The oxidation process may also oxidize the top portion of the gate stack to form a metal oxide layer 128 on the work function metal layer 124 and the gate electrode layer 126. The metal oxide layer 128 is in direct contact with the work function metal layer 124 and the gate electrode layer 126.

The oxidation process includes, for example, a thermal process using an oxygen-containing gas, an ashing process using an oxygen-containing gas, a sputtering process using an oxygen gas, or other suitable oxidation methods for oxidizing the residues 10. Alternatively, the oxidation process includes applying an oxidizing solution on the residues 10 and the gate stack.

The metal oxide structures 10a may have a strong adhesion with the surfaces 101 of the insulating layer 120, the contact etch stop layer 118, the work function metal layer 124, and/or the gate electrode layer 126. A strong interface 12 between the metal oxide structures 10a and the surfaces 101 is formed.

After the oxidation process, a deposition process 200 is performed to deposit an oxide film 130 on the insulating layer 120 and the gate stack, in accordance with some embodiments. The oxide film 130 is a continuous film. The oxide film 130 may cover or be in direct contact with the insulating layer 120, the contact etch stop layer 118, the spacers 110, the metal oxide layer 128 (or the work function metal layer 124 and the gate electrode layer 126), and the metal oxide structures 10a.

A strong interface 14 between the oxide film 130 and the surfaces 101 is formed. The oxide film 130 may have a strong adhesion with the surfaces 101 and a subsequently formed layer to prevent etchants from diffusing through the interface 14 and the interface between the oxide film 130 and the subsequently formed layer.

The oxide film 130 is made of, for example, silicon oxide, aluminum oxide, or other oxide-containing materials suitable to adhere to the surfaces 101 and the subsequently formed layer. The oxide film 130 may have a thickness T ranging from about 10 Å to about 30 Å. The deposition process 200 includes, for example, a chemical vapor deposition process, a sputtering process, a physical vapor deposition process, or other suitable oxide film deposition processes.

Figure 1F:
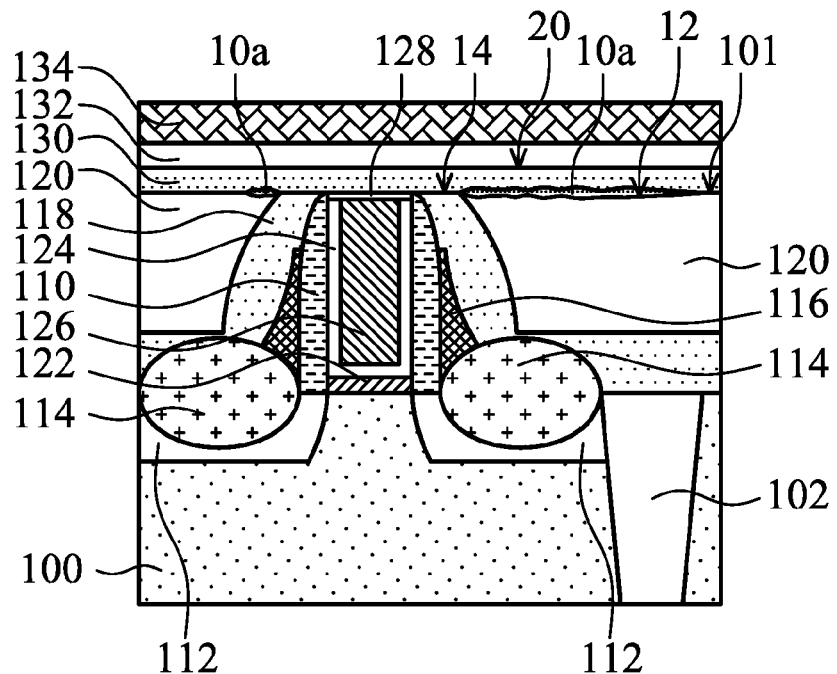

As shown in FIG. 1F, a stop layer 132 (also called an insulating layer or a dielectric layer) is deposited over the surfaces 101 of the insulating layer 120, the contact etch stop layer 118, the work function metal layer 124, and the gate electrode layer 126, in accordance with some embodiments. The stop layer 132 may be formed on the oxide film 130. The stop layer 132 is made of silicon nitride or other suitable materials. In some embodiments, the interface 20 between the oxide film 130 and the stop layer 132 has improved quality.

Figure 2:
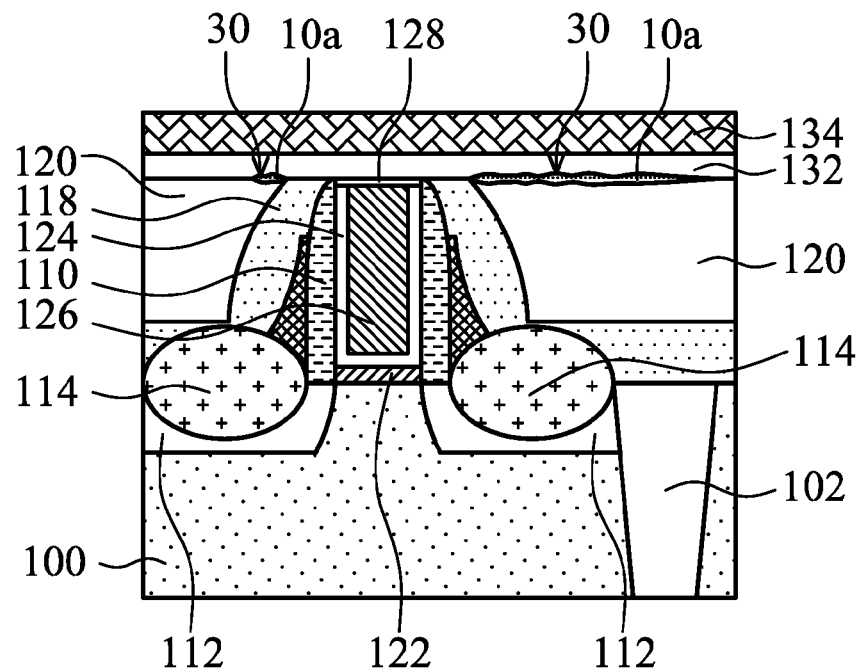
FIG. 2 is a cross-sectional view of an intermediate stage of a process for forming a semiconductor device, in accordance with some embodiments.

Embodiments of the disclosure have many variations. For example, in some other embodiments, as shown in FIG. 2, the oxide film 130 is not formed. The metal oxide structures 10a is in direct contact with the stop layer 132. The interface 30 between the metal oxide structures 10a and the stop layer 132 also has improved quality.

Referring back to FIG. 1F, a protective layer 134 is formed on the stop layer 132. The protective layer 134 is configured to protect the stop layer 132 from being damaged during a subsequent pre-amorphized implantation (PAI) process, in accordance with some embodiments. The protective layer 134 includes, for example, a plasma-enhanced oxide (PEOX) layer.

Figure 1G:
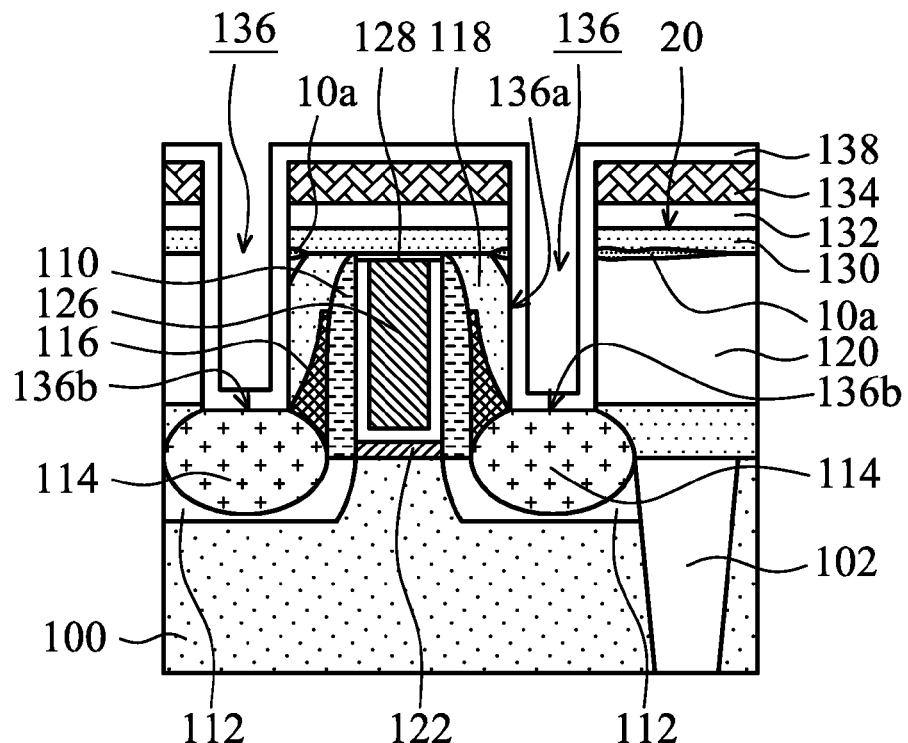

Afterwards, as shown in FIG. 1G, the protective layer 134, the stop layer 132, the oxide film 130 and the insulating layer 120 may be patterned to form contact openings 136 exposing the stressors 114, respectively. A photolithography process and an etching process may be used for patterning. In some embodiments, the stop layer 132 directly contacts with the entire top surface of the oxide film 130. Therefore, due to the good adhesion between the stop layer 132 and the oxide film 130, no interfacial delamination occurs. The strong interface 20 may prevent the etchants used for forming the contact openings 136 from diffusing and damaging the gate electrode layer 126. The gate electrode layer 126 covered by the metal oxide layer 128 may be prevented from being damaged.

Thereafter, as shown in FIG. 1G, a dielectric spacer liner (DSL) layer 138 is conformally formed on the protective layer 134 and the sidewalls 136a and the bottoms 136b of the contact openings 136, in accordance with some embodiments. The DSL layer 138 is configured to protect the sidewalls 136a from being damaged by the subsequent PAI process. The DSL layer 138 is made of, for example, SiOC or other suitable materials. The DSL layer 138 is formed by, for example, an atomic layer deposition process or other suitable processes. In some embodiments, the DSL layer 138 is in direct contact with the oxide film 130.

Figure 1H:
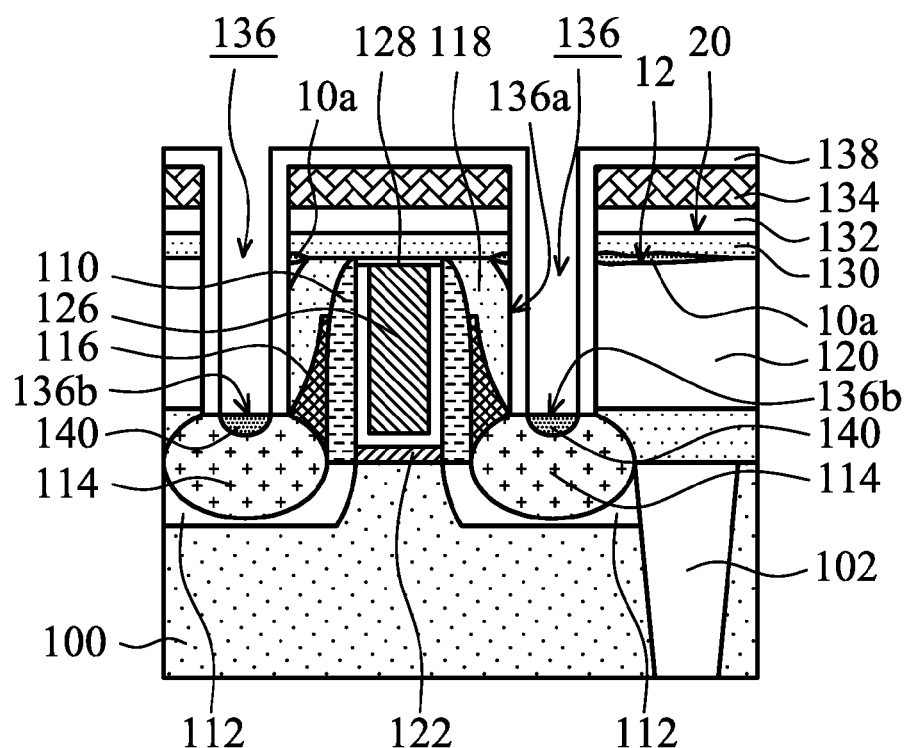

Afterwards, as shown in FIG. 1H, an etching process is performed to remove the DSL layer 138 on the bottoms 136b of the openings 136 so as to expose a portion of the stressors 114. The etching process includes, for example, an argon plasma etching process.

Afterwards, a cleaning process may be performed to clean the residues from the etching process of the DSL layer 138 on the bottoms 136b. The cleaning process includes, for example, an APM cleaning process using a cleaning solution containing $NH_4OH$, $H_2O_2$, and $H_2O$. In these cases, the strong interface 20 between the oxide film 130 and the stop layer 132 may prevent the cleaning solution used in the cleaning process from diffusing and damaging the gate electrode layer 126.

A pre-amorphized implantation (PAI) process may be performed to reduce the dopant channeling effect and enhance dopant activation. In some embodiments, silicon, germanium or carbon is used. In some other embodiments, inert gases, such as neon, argon, krypton, xenon, and/or radon, are used. The PAI process prevents subsequently doped impurities from channeling through spaces within the crystal lattice structure and reaching depths greater than desired. Portions of the stressors 114 exposed and located at the bottoms 136b of the openings 136 are turned into an amorphous state as a result of the PAI process.

Thereafter, a salicidation (self-aligned silicidation) process is performed to form metal silicide regions 140 on/in the stressors 114, in accordance with some embodiments. The material of the metal silicide regions 140 may be made of nickel silicide. In some embodiments, the metal silicide regions 140 are made of a silicide material of a suitable metal material. The suitable metal material may be made of cobalt (Co), nickel (Ni), platinum (Pt), titanium (Ti), ytterbium (Yb), molybdenum (Mo), erbium (Er), or combinations thereof. In some embodiments, the salicidation process is optional.

Then, an un-reacted portion of a deposited metal film for forming the metal silicide regions 140 is removed by using, for example, an etching process. The etching process may include a wet etching process, dry etching process, or combinations thereof. In some embodiments, a wet etching process is adopted to remove the un-reacted metal film. An etchant, such as hot phosphoric acid, is chosen to remove the un-reacted portion of the metal film.

As shown in FIG. 1H, the strong interface 20 between the oxide film 130 and the stop layer 132 may prevent the etchant used in the etching process from diffusing and damaging the gate electrode layer 126.

Figure 1I:
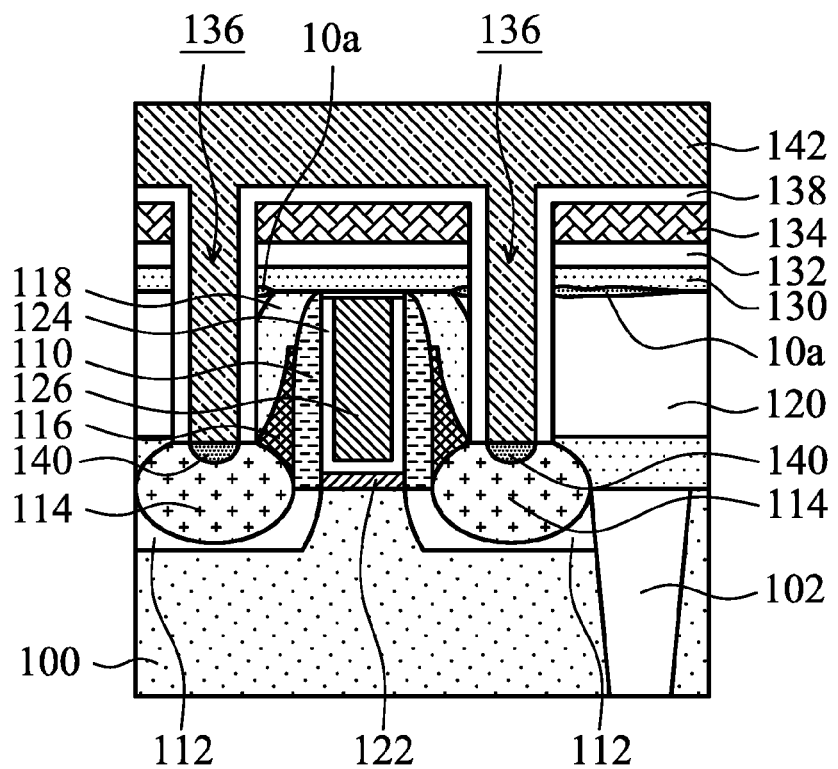

As shown in FIG. 1I, a conductive layer 142 is deposited on the protective layer 134 and is filled into the openings 136 to electrically contact the metal silicide regions 140. The conductive layer 142 is formed by, for example, a PVD process or other suitable processes. The conductive layer 142 is made of, for example, tungsten or other suitable conductive materials.

Figure 1J:
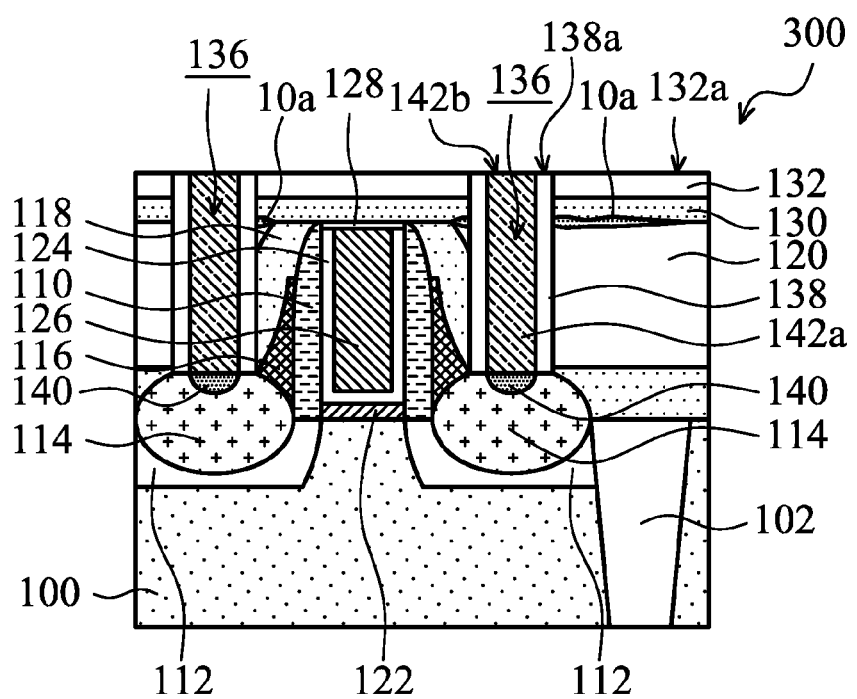

As shown in FIG. 1J, a chemical mechanical polishing (CMP) process is performed to remove the conductive layer 142 and the DSL layer 138 outside the openings 136, and the protective layer 134. After the CMP process, the conductive layer 142 remaining in the openings 136 forms contact plugs 142a electrically connecting the metal silicide regions 140 and the doped regions 112 (i.e. the S/D regions).

After the CMP process, top surfaces 142b, 138a and 132a of the contact plugs 142a, the DSL layer 138, and the stop layer 132 may be coplanar with each other. As shown in FIG. 1J, a semiconductor device 300 is formed. The semiconductor device 300 may be an n-type metal-oxide-semiconductor field-effect transistor (MOSFET) or a p-type MOSFET.

Figure 3:
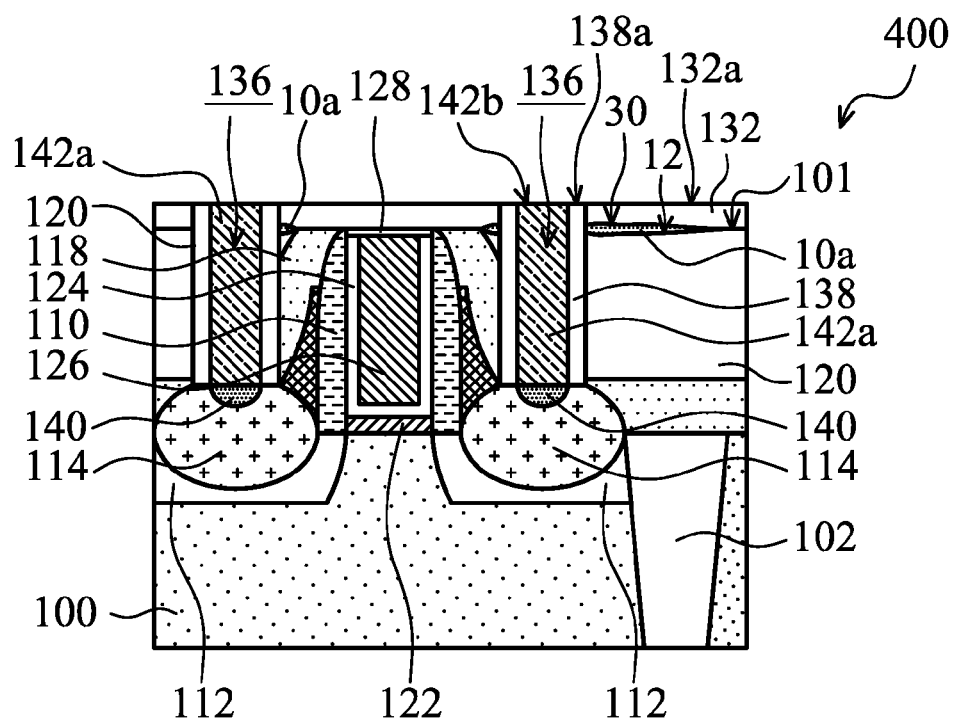
FIG. 3 is a cross-sectional view of a semiconductor device, in accordance with some embodiments.

FIG. 3 is a cross-sectional view of a semiconductor device, in accordance with some embodiments. As shown in FIG. 3, the semiconductor device 400 is similar to the semiconductor device 300 shown in FIG. 1J except that the semiconductor device 400 does not have the oxide film 130. Therefore, the metal oxide structures 10a is in direct contact with the stop layer 132, which forms a strong interface 30 between the metal oxide structures 10a and the stop layer 132. The strong interface 30 may prevent the etchants used for forming the contact openings 136 and used during the cleaning process from diffusing and damaging the gate electrode layer 126.

Embodiments of mechanisms for forming a semiconductor device described above oxidize the residues coming from the removed gate electrode layer or the removed work function metal layer. Therefore, the residues are oxidized into metal oxide structures. The metal oxide structures improve adhesion between a stop layer (also called a dielectric layer) and various layers near and surrounding a gate electrode layer. Due to the good adhesion between the stop layer and the metal oxide structures, the gate electrode layer is prevented from being damaged or removed during subsequent process steps. As a result, the process yields are greatly improved.

Furthermore, an oxide film may be formed on the layers near and surrounding the gate electrode layer to cover the metal oxide structures. The oxide film improves adhesion between the stop layer and the layers near and surrounding the gate electrode layer. Due to the good adhesion between the stop layer and the oxide film, the gate electrode layer is prevented from being damaged or removed during subsequent process steps. As a result, the process yields are greatly improved.

In accordance with some embodiments, a semiconductor device is provided. The semiconductor device includes a semiconductor substrate and a metal gate stack formed over the semiconductor substrate. The semiconductor device also includes an insulating layer formed over the semiconductor substrate and surrounding the metal gate stack, wherein the metal gate stack includes a metal gate electrode. The semiconductor device further includes a metal oxide structure formed over the insulating layer and in direct contact with the insulating layer. The metal oxide structure includes an oxidized material of the metal gate electrode.

In accordance with some embodiments, a semiconductor device is provided. The semiconductor device includes a semiconductor substrate and a metal gate stack formed over the semiconductor substrate. The semiconductor device also includes an insulating layer formed over the semiconductor substrate and surrounding the metal gate stack, wherein the metal gate stack includes a metal gate electrode. The semiconductor device further includes a metal oxide structure formed over the insulating layer. The metal oxide structure includes an oxidized material of the metal gate electrode. The semiconductor device also includes an oxide film formed over the insulating layer and the metal gate stack to cover the metal oxide structure. The oxide film is a continuous film and is in direct contact with the metal oxide structure and the insulating layer.

In accordance with some embodiments, a method for forming a semiconductor device is provided. The method includes providing a semiconductor substrate, a dummy gate and an insulating layer. The dummy gate and the insulating layer is formed over the semiconductor substrate, and the insulating layer surrounds the dummy gate. The method also includes removing the dummy gate, thereby forming an opening in the insulating layer. The method further includes depositing a metal gate electrode layer over the insulating layer to fill the opening. The method also includes removing the metal gate electrode layer outside of the opening, such that the metal gate electrode layer remaining in the opening forms a metal gate electrode. After the removal of the metal gate electrode layer, residues coming from the metal gate electrode layer are left on the insulating layer. The method further includes performing an oxidation process to oxidize the residues into metal oxide structures.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for forming a semiconductor device, comprising:
    providing a semiconductor substrate, a dummy gate, and an insulating layer, wherein the dummy gate and the insulating layer is formed over the semiconductor substrate, and the insulating layer surrounds the dummy gate;
    removing the dummy gate, thereby forming an opening in the insulating layer;
    depositing a metal gate electrode layer over the insulating layer to fill the opening;
    removing the metal gate electrode layer outside of the opening, such that the metal gate electrode layer remaining in the opening forms a metal gate electrode, wherein after the removal of the metal gate electrode layer outside of the opening, residues coming from the metal gate electrode layer are left on the insulating layer; and
    performing an oxidation process to oxidize the residues into metal oxide structures.

2. The method for forming a semiconductor device as claimed in claim 1, wherein the oxidation process comprises a thermal process, an ashing process, a sputtering process, or applying an oxidizing solution on the residues.

3. The method for forming a semiconductor device as claimed in claim 1, wherein the oxidation process also oxidizes a top portion of the metal gate electrode to form a metal oxide layer.

4. The method for forming a semiconductor device as claimed in claim 1, further comprising:
    after the oxidation process, performing a deposition process to deposit an oxide film on the insulating layer, the metal gate electrode and the metal oxide structures.

5. The method for forming a semiconductor device as claimed in claim 4, further comprising:
    after the deposition process of the oxide film, forming a stop layer on the oxide film, wherein the stop layer is in direct contact with the oxide film.

6. The method for forming a semiconductor device as claimed in claim 1, further comprising:
    after the oxidation process, forming contact openings passing through the insulating layer to expose a source region and a drain region of the semiconductor substrate; and
    performing a salicidation process to form metal silicide regions in the source region and the drain region exposed by the contact openings.

7. The method for forming a semiconductor device as claimed in claim 6, further comprising:
    forming a dielectric spacer liner layer on sidewalls of the contact openings; and
    forming contact plugs in the contact openings respectively, wherein the contact plugs are electrically connected to the metal silicide regions respectively.

8. The method for forming a semiconductor device as claimed in claim 7, wherein the contact openings further pass through the metal oxide structures.

9. A method for forming a semiconductor device, comprising:
    providing a semiconductor substrate, a dummy gate, and an insulating layer, wherein the dummy gate and the insulating layer is formed over the semiconductor substrate, and the insulating layer surrounds the dummy gate;
    removing the dummy gate, thereby forming an opening in the insulating layer;
    depositing a work function metal layer over the insulating layer and a sidewall of the opening;
    depositing a metal gate electrode layer over the work function metal layer to fill the opening;
    removing the metal gate electrode layer outside of the opening and the work function metal layer outside of the opening, such that the work function metal layer and the metal gate electrode layer remaining in the opening together form a metal gate stack, wherein after the removal of the metal gate electrode layer and the work function metal layer outside of the opening, residues coming from the metal gate electrode layer and the work function metal layer are left on the insulating layer; and
    performing an oxidation process to oxidize the residues into metal oxide structures.

10. The method for forming a semiconductor device as claimed in claim 9, wherein the oxidation process also oxidizes a top portion of the metal gate stack to form a metal oxide layer.

11. The method for forming a semiconductor device as claimed in claim 10, further comprising:
    after the oxidation process of the residues, performing a deposition process to deposit an oxide film on and in direct contact with the insulating layer, the metal oxide layer, and the metal oxide structures.

12. The method for forming a semiconductor device as claimed in claim 9, further comprising:
    after the oxidation process of the residues, performing a deposition process to deposit an oxide film on and in direct contact with the insulating layer, the work function metal layer, the metal gate electrode layer, and the metal oxide structures.

13. The method for forming a semiconductor device as claimed in claim 9, wherein a lower surface of the metal oxide structure is substantially coplanar with an upper surface of the metal gate stack.

14. The method for forming a semiconductor device as claimed in claim 9, wherein the metal oxide structures are in direct contact with the insulating layer.

15. The method for forming a semiconductor device as claimed in claim 14, wherein the metal oxide structures are partially embedded in the insulating layer.

16. A method for forming a semiconductor device, comprising:

providing a semiconductor substrate, a dummy gate, and an insulating layer, wherein the dummy gate and the insulating layer is formed over the semiconductor substrate, and the insulating layer surrounds the dummy gate;

removing the dummy gate, thereby forming an opening in the insulating layer;

depositing a metal gate electrode layer over the insulating layer to fill the opening;

removing the metal gate electrode layer outside of the opening, such that the metal gate electrode layer remaining in the opening forms a metal gate electrode, wherein after the removal of the metal gate electrode layer outside of the opening, residues coming from the metal gate electrode layer are left on the insulating layer;

performing an oxidation process to oxidize the residues into metal oxide structures; and forming contact plugs passing through the metal oxide structures and the insulating layer.

17. The method for forming a semiconductor device as claimed in claim 16, further comprising:

after the oxidation process, performing a deposition process to deposit an oxide film on the insulating layer, the metal gate electrode, and the metal oxide structures, wherein the contact plugs further pass through the oxide film.

18. The method for forming a semiconductor device as claimed in claim 17, further comprising:

after the deposition process of the oxide film, forming a stop layer on the oxide film, wherein the stop layer is in direct contact with the oxide film, and the contact plugs further pass through the stop layer.

19. The method for forming a semiconductor device as claimed in claim 16, wherein a lower surface of the metal oxide structure is substantially coplanar with an upper surface of the metal gate electrode.

20. The method for forming a semiconductor device as claimed in claim 16, wherein the metal oxide structures are partially embedded in the insulating layer.

* * * * *